(12) United States Patent
Liang et al.

(10) Patent No.: US 11,600,747 B2
(45) Date of Patent: Mar. 7, 2023

(54) DISPLAY BACKPLANE AND METHOD OF MANUFACTURING THE SAME, DISPLAY DEVICE

(71) Applicant: BOE TECHNOLOGY GROUP CO., LTD., Beijing (CN)

(72) Inventors: Zhiwei Liang, Beijing (CN); Yingwei Liu, Beijing (CN); Han Yue, Beijing (CN); Minghua Xuan, Beijing (CN); Hsuanwei Mai, Beijing (CN); Zhanfeng Cao, Beijing (CN); Ke Wang, Beijing (CN); Huijuan Wang, Beijing (CN); Guangcai Yuan, Beijing (CN); Zhijun Lv, Beijing (CN); Xinhong Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 238 days.

(21) Appl. No.: 16/959,097

(22) PCT Filed: Aug. 16, 2019

(86) PCT No.: PCT/CN2019/100920
§ 371 (c)(1),
(2) Date: Jun. 29, 2020

(87) PCT Pub. No.: WO2021/030927
PCT Pub. Date: Feb. 25, 2021

(65) Prior Publication Data
US 2021/0408331 A1 Dec. 30, 2021

(51) Int. Cl.
*H01L 33/38* (2010.01)
*H01L 27/15* (2006.01)
(Continued)

(52) U.S. Cl.
CPC ............ *H01L 33/38* (2013.01); *H01L 27/156* (2013.01); *H01L 33/005* (2013.01); *H01L 33/62* (2013.01);
(Continued)

(58) Field of Classification Search
None
See application file for complete search history.

(56) References Cited

U.S. PATENT DOCUMENTS 10,325,894 B1   6/2019  Pan
2008/0017873 A1  1/2008  Tomoda et al.
(Continued)

FOREIGN PATENT DOCUMENTS

CN   101656216 A   2/2010
CN   101752336 A   6/2010
(Continued)

OTHER PUBLICATIONS

International Search Report and Written Opinion dated Feb. 5, 2020, from International Application No. PCT/CN2019/089543, 14 pages.
(Continued)

*Primary Examiner* — Su C Kim
(74) *Attorney, Agent, or Firm* — Procopio, Cory, Hargreaves & Savitch

(57) ABSTRACT

A display backplane includes a base, a plurality of driving electrodes disposed above the base, and a connection structure disposed on at least one of the plurality of driving electrodes. An orthographic projection of the connection structure on the base is within an orthographic projection of a corresponding driving electrode on the base; and the connection structure includes at least one conductive portion disposed at a first included angle with the corresponding driving electrode.

17 Claims, 7 Drawing Sheets

(51) Int. Cl.
  *H01L 33/00* (2010.01)
  *H01L 33/62* (2010.01)
(52) U.S. Cl.
  CPC ............ *H01L 2933/0016* (2013.01); *H01L 2933/0066* (2013.01)

(56) References Cited

U.S. PATENT DOCUMENTS

| | | |
|---|---|---|
| 2010/0044416 A1 | 2/2010 | Ogawa |
| 2010/0140805 A1 | 6/2010 | Chang et al. |
| 2011/0140271 A1 | 6/2011 | Daubenspeck et al. |
| 2012/0273133 A1 | 9/2012 | Chen et al. |
| 2013/0207239 A1 | 8/2013 | Yu et al. |
| 2017/0048976 A1 | 2/2017 | Prevatte et al. |
| 2017/0062397 A1 | 3/2017 | Park |
| 2017/0287789 A1 | 10/2017 | Bower et al. |
| 2018/0042110 A1 | 2/2018 | Cok |
| 2018/0182740 A1 | 6/2018 | Kim et al. |
| 2018/0197461 A1 | 7/2018 | Lai et al. |
| 2018/0247584 A1 | 8/2018 | Chen |
| 2019/0051672 A1* | 2/2019 | Lee ............ H01L 27/3248 |
| 2019/0333897 A1 | 10/2019 | Chen |
| 2020/0035748 A1 | 1/2020 | Xia et al. |
| 2020/0168661 A1 | 5/2020 | Xue |
| 2021/0273133 A1 | 9/2021 | Chen et al. |

FOREIGN PATENT DOCUMENTS

| | | |
|---|---|---|
| CN | 103117246 A | 5/2013 |
| CN | 103247587 A | 8/2013 |
| CN | 106486493 A | 3/2017 |
| CN | 106876552 A | 6/2017 |
| CN | 108183156 A | 6/2018 |
| CN | 108493154 A | 9/2018 |
| CN | 108933153 A | 12/2018 |
| CN | 109285856 A | 1/2019 |
| CN | 109494292 A | 3/2019 |
| CN | 109755376 A | 5/2019 |
| CN | 109887950 A | 6/2019 |
| CN | 109950270 A | 6/2019 |
| CN | 110047866 A | 7/2019 |
| CN | 110061106 A | 7/2019 |
| CN | 110100309 A | 8/2019 |
| TW | 21826517 A | 7/2018 |
| TW | 201826517 A | 7/2018 |
| WO | 2017149521 A1 | 9/2017 |
| WO | 2018111752 A1 | 6/2018 |

OTHER PUBLICATIONS

International Search Report and Written Opinion dated Mar. 13, 2020, from International Application No. PCT/CN2019/126708, 11 pages.

The State Intellectual Property Office of People's Republic of China. The First Office Action dated Jun. 8, 2022. Chinese Patent Application No. 201980000782.X. Name of Applicant: Jing Oriental Technology Co., Ltd. English Language Translation. 7 pages.

The State Intellectual Property Office of People's Republic of China. The First Office Action dated Jun. 8, 2022. Chinese Patent Application No. 201980000782.X. Name of Applicant: Jing Oriental Technology Co., Ltd. Chinese Language. 6 pages.

U.S. Patent & Trademark Office. U.S. Appl. No. 16/765,530. Non-Final Office Action dated Apr. 20, 2022. 23 pages.

Intellectual Property India Patent Office. India Application No. 202027053419. Examination Report dated Mar. 29, 2022. Indian Language and English Language Translation. 6 pages.

China National Intellectual Property Administration. Chinese Application No. 201980001362.3. Notification of the First Office Action dated Apr. 1, 2022. Name of Applicant: Boe Technology Group Co., Ltd. Chinese Language. 7 pages.

China National Intellectual Property Administration. Chinese Application No. 201980001362.3. Notification of the First Office Action dated Apr. 1, 2022. Name of Applicant: Boe Technology Group Co., Ltd. English Language Translation. 8 pages.

* cited by examiner

DISPLAY BACKPLANE AND METHOD OF MANUFACTURING THE SAME, DISPLAY DEVICE

CROSS-REFERENCE TO RELATED APPLICATION

This application is a national phase entry under 35 USC 371 of International Patent Application No. PCT/CN2019/100920 filed on Aug. 16, 2019, which is incorporated herein by reference in its entirety.

TECHNICAL FIELD

The present disclosure relates to the field of display technologies, and in particular, to a display backplane and a method of manufacturing the same, and a display device.

BACKGROUND

With the development of display technologies, micro light-emitting diode (abbreviated as Micro-LED) display devices have advantages such as self-illumination, high brightness, high contrast, a ultra-high resolution, ultra-high color saturation, a long service life, a fast response, low energy consumption, good adaptability to various environments and the like. Therefore, the Micro-LED display devices are able to be applied to fields of micro-displays such as augmented reality (abbreviated as AR) displays or virtual reality (abbreviated as VR) displays, medium-sized displays such as mobile phones and televisions (TV), and large-screen displays in movie theaters.

SUMMARY

In one aspect, a display backplane is provided. The display backplane includes: a base, a plurality of driving electrodes disposed above the base, and a connection structure disposed on at least one of the plurality of driving electrodes. An orthographic projection of the connection structure on the base is within an orthographic projection of a corresponding driving electrode on the base; and the connection structure includes at least one conductive portion disposed at a first included angle with the corresponding driving electrode.

In some embodiments, the first included angle is within a range from 85° to 95°, inclusive.

In some embodiments, the connection structure further includes a bottom portion connected to the at least one conductive portion, and the bottom portion is directly in contact with the corresponding driving electrode.

In some embodiments, the at least one conductive portion and the bottom portion in a same connection structure are an integrated structure.

In some embodiments, the at least one conductive portion includes a plurality of conductive portions, and the plurality of conductive portions are arranged at intervals around a contour of the bottom portion.

In some embodiments, an orthographic projection of the at least one conductive portion on the base is in a closed shape.

In some embodiments, the at least one conductive portion has a tubular structure.

In some embodiments, the at least one conductive portion has a tubular structure with a side wall, the side wall includes at least one crack, and the at least one crack extends to a surface of an end wall on a side of the tubular structure away from the driving electrode.

In some embodiments, a hardness of the at least one conductive portion is greater than a hardness of the corresponding driving electrode.

In some embodiments, a material of the at least one conductive portion includes tungsten, titanium or molybdenum.

In some embodiments, the display backplane further includes a conductive plating layer disposed on the at least one conductive portion in each connection structure.

In some embodiments, the display backplane has a plurality of sub-pixel regions; and at least two of the plurality of driving electrodes are located in one of the plurality of sub-pixel regions.

In some embodiments, the display backplane further includes at least one driving transistor located in one of the plurality of sub-pixel regions and disposed on the base. The at least two driving electrodes are located on a side of a corresponding driving transistor facing away from the base. One of every two driving electrodes in a same sub-pixel region is electrically connected to a corresponding driving transistor.

In another aspect, a method of manufacturing a display backplane is provided. The method of manufacturing the display backplane includes: providing a base; forming a plurality of driving electrodes above the base; and forming a connection structure on at least one of the plurality of driving electrodes, an orthographic projection of the connection structure on the base being within an orthographic projection of a corresponding driving electrode on the base, and the connection structure including at least one conductive portion disposed at a first included angle with the corresponding driving electrode.

In some embodiments, forming the connection structure on at least one of the plurality of driving electrodes, includes: forming a first target layer and a second target layer in a stack on a side of at least one of the plurality of driving electrodes facing away from the base, and a hardness of the second target layer being greater than a hardness of the first target layer; forming at least one through hole penetrating through the second target layer and the first target layer, the at least one through hole being located in a region where the at least one of the plurality of driving electrodes is located, and the at least one through hole being in a one-to-one correspondence with the at least one driving electrode; depositing a first metal film, and a portion of the first metal film in each of the at least one through hole being electrically connected to a corresponding driving electrode; patterning the first metal film to retain the portion of the first metal film in each through hole; and removing the second target layer and the first target layer to form the connection structure.

In some embodiments, after the first metal film is deposited and before the first metal film is patterned, the method of manufacturing the display backplane further includes: forming a photoresist on the portion of the first metal film in each through hole by a coating process. Patterning the first metal film, further includes: patterning the first metal film by chemical mechanical polishing. Removing the second target layer and the first target layer to form the connection structure, further includes: removing the second target layer, the first target layer and the photoresist to form the connection structure.

In some embodiments, after the first metal film is deposited and before the first metal film is patterned, the method of manufacturing the display backplane further includes: forming a photoresist by a coating process, and the photoresist at least covering the portion of the first metal film in each through hole; patterning the photoresist to retain a portion of the photoresist in each through hole, taking a surface of the base as a reference plane, a surface of the patterned photoresist facing away from the base is not lower than a surface of the first metal film facing away from the base, and a dimension of an orthographic projection of the portion of the patterned photoresist in each through hole on the base is same as or approximately same as an aperture of a corresponding through hole. Removing the second target layer and the first target layer to form the connection structure, further includes: removing the second target layer, the first target layer and the patterned photoresist to form the connection structure.

In some embodiments, a material of the first target layer is an organic insulating material; or, a material of the second target layer is one of an inorganic insulating material and a metal material; or, a material of the first target layer is an organic insulating material, and a material of the second target layer is one of an inorganic insulating material and a metal material.

In yet another aspect, a display device is provided. The display device includes: the display backplane as described above; and a micro light-emitting diode electrically connected to every two connection structures in the display backplane correspondingly.

BRIEF DESCRIPTION OF THE DRAWINGS

In order to describe technical solutions in some embodiments of the present disclosure more clearly, the accompanying drawings to be used in some embodiments of the present disclosure will be introduced briefly. Obviously, the accompanying drawings to be described below are merely some embodiments of the present disclosure, and a person of ordinary skill in the art can obtain other drawings according to those drawings.

DETAILED DESCRIPTION

Figure 1:
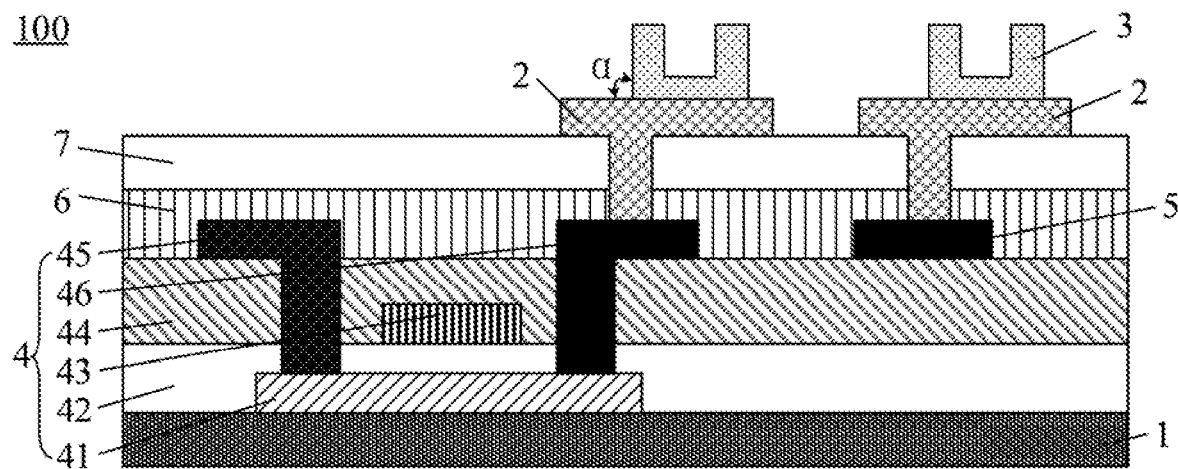
FIG. 1 is a schematic diagram showing a structure of a display backplane, in accordance with some embodiments of the present disclosure.
Figure 2:
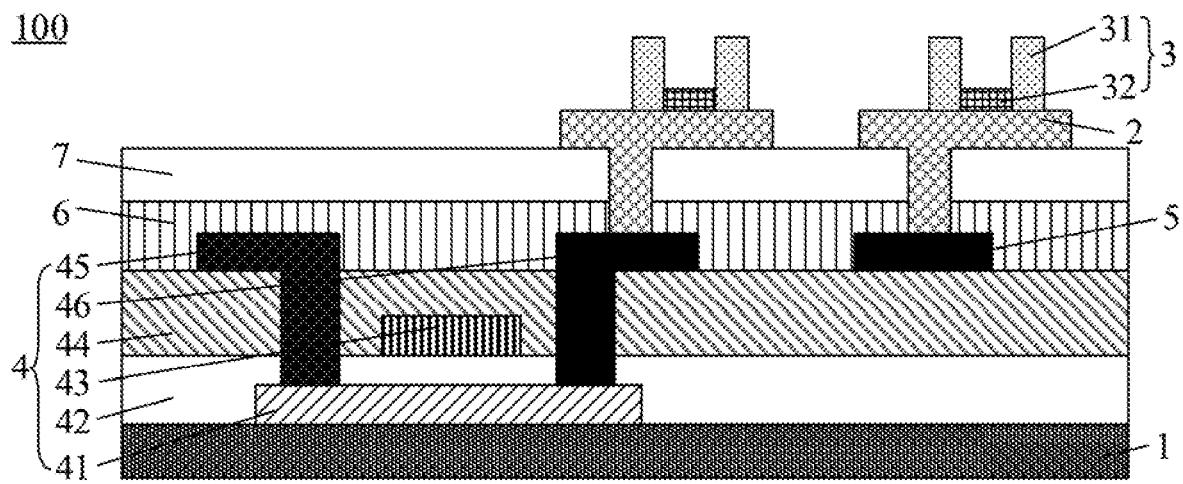
FIG. 2 is a schematic diagram showing a structure of another display backplane, in accordance with some embodiments of the present disclosure.

The technical solutions in embodiments of the present disclosure will be described clearly and completely in combination with the accompanying drawings in some embodiments of the present disclosure. Obviously, the described embodiments are merely some but not all the embodiments of the present disclosure. All other embodiments made on the basis of the embodiments of the present disclosure by a person of ordinary skill in the art shall be included in the protection scope of the present disclosure.

In a Micro-LED display device, a size of each Micro-LED is generally less than or equal to 100 μm, and a measurement precision of a distance between two adjacent Micro-LEDs is also on a micron-scale. The Micro-LED display device includes a display backplane, and each Micro-LED of the Micro-LED display device is generally transferred to the display backplane by means of mass transfer technology. However, in the process of transferring each Micro-LED to the display backplane, there are problems of low efficiency, low yield, and low reliability in a bonding between each Micro-LED and a corresponding electrode in the display backplane.

Based on this, with reference to FIGS. 1 to 10, some embodiments of the present disclosure provide a display backplane 100. The display backplane 100 includes a base 1, a plurality of driving electrodes 2 disposed above the base 1, and a connection structure 3 disposed on at least one of the plurality of driving electrodes 2. An orthographic projection of the connection structure 3 on the base 1 is within an orthographic projection of a corresponding driving electrode 2 on the base 1.

Herein, each of the at least one driving electrode 2 is correspondingly provided with a connection structure 3. Each connection structure 3 includes at least one conductive portion 31 disposed at a first included angle α with the corresponding driving electrode 2.

The base 1 is configured to support the plurality of driving electrodes 2 and the connection structure 3 disposed on the at least one driving electrode 2. In some examples, the base 1 may be a blank substrate, such as a glass substrate not provided with any film, and the plurality of driving electrodes 2 are directly disposed on the glass substrate, so that a thickness of the entire display backplane 100 is small.

In some other examples, the base 1 is a substrate including at least one film. Herein, the at least one film includes at least one of a polyimide layer (abbreviated as PI layer), a buffer layer, or a light shielding layer. A plurality of driving electrodes 2 and a driving circuit for supplying signals to the plurality of driving electrodes 2 are all disposed on the substrate including the at least one film. The PI layer, the buffer layer, or the like may provide support for the plurality of driving electrodes 2 and the driving circuit and block external forces, so as to protect each driving electrode 2 and the driving circuit.

Each connection structure 3 is disposed on a surface of the driving electrode 2 facing away from the base 1. That is, each connection structure 3 is in direct contact with a corresponding driving electrode 2. Each connection structure 3 includes at least one conductive portion 31, and the at least one conductive portion 31 is disposed at a first included angle α with the corresponding driving electrode 2, and each conductive portion 31 is configured to be plugged into a pin of a corresponding microelectronic component. In this way, each connection structure 3 may not only be electrically connected to the corresponding driving electrode 2, but also may well be plugged into the pin of the corresponding microelectronic component, so as to transmit a driving signal on the corresponding driving electrode 2 to the corresponding microelectronic component, thereby controlling operation states of the corresponding microelectronic component.

Figure 6:
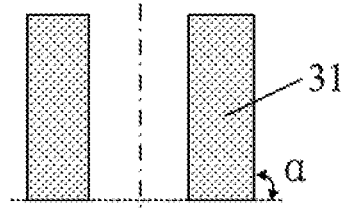
FIG. 6 is a sectional view of the connection structure taken along direction A-A' in FIG. 5.
Figure 7:
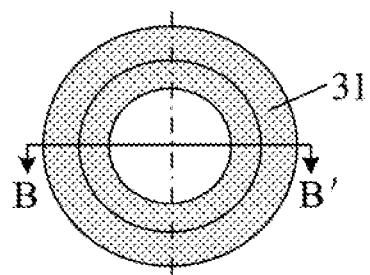
FIG. 7 is a top view of another connection structure, in accordance with some embodiments of the present disclosure.
Figure 8:
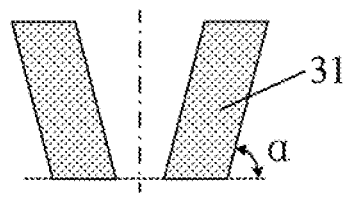
FIG. 8 is a sectional view of the connection structure taken along direction B-B' in FIG. 7.

For example, with reference to FIGS. 1, 6 and 8, the first included angle α between the at least one conductive portion 31 and the corresponding driving electrode 2 is within a range from 85° to 95°, inclusive. That is, each of the at least one conductive portion 31 is perpendicular (or approximately perpendicular) to the surface of the corresponding driving electrode 2 facing away from the base 1. In this way, in the process of plugging each connection structure 3 into the pin of the corresponding microelectronic component, each conductive portion 31 in each connection structure 3 may not only easily penetrate into the pin of the corresponding microelectronic component, so as to achieve a good electrical connection by means of interdiffusion (that is, atoms in each conductive portion 31 migrate into the corresponding pin, and atoms in each pin migrate into the corresponding conductive part 31), but also may ensure that force received by the conductive portion 31 in a direction parallel to a plane where the base 1 is located is small or negligible, so as to avoid deformation of the conductive portion 31 due to the force and a problem of electrical connection failure due to the deformation.

In some embodiments of the present disclosure, a plurality of connection structures 3 configured to connect the pins of corresponding microelectronic components are disposed on the corresponding driving electrodes 2 in the display backplane 100, which is not only convenient for manufacturing, but also has a lower manufacturing cost, thereby realizing mass production of the plurality of connection structures 3 over a large area. In addition, during the mass transfer process of a plurality of microelectronic components to the display backplane 100, the plurality of connection structures 3 may also be effectively plugged into the pins of the corresponding microelectronic components, thereby effectively improving bonding efficiency, bonding yield and bonding reliability of each microelectronic component and the corresponding driving electrode 2 in the display backplane 100.

In some embodiments, with reference to FIGS. 5 to 10, an orthographic projection of the at least one conductive portion 31 in each connection structure 3 on the base 1 is in a closed shape. That is, each connection structure 3 is composed of at least one conductive portion 31, so that a boundary shape of an orthographic projection of each connection structure 3 on the base 1 is closed.

For example, the boundary shape of the orthographic projection of each connection structure 3 on the base 1 is a circle, an ellipse, any polygon, or the like, herein it is possible for the circle, the ellipse or any polygon to be hollow or solid. Accordingly, if the orthographic projection of each connection structure 3 on the base 1 has a hollow pattern, the connection structure 3 has a tubular structure, such as a circular tube or a square tube. If the orthographic projection of each connection structure 3 on the base 1 has a solid pattern, the connection structure 3 has a conical structure with a sharp angle at the top, such as a cone or a pyramid.

Figure 9:
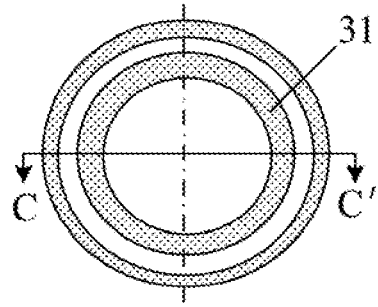
FIG. 9 is a top view of yet another connection structure, in accordance with some embodiments of the present disclosure.
Figure 10:
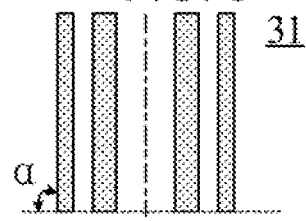
FIG. 10 is a sectional view of the connection structure taken along direction C-C' in FIG. 9.

In addition, with reference to FIGS. 9 and 10, in some examples, each connection structure 3 includes a plurality of conductive portions 31, each conductive portion 31 has a tubular structure, and the plurality of conductive portions 31 have different tube diameters and are nested in sequence. In this way, the orthographic projection of the connection structure 3 on the base 1 has a plurality of hollow patterns nested in sequence as shown in FIG. 9.

Figure 11:
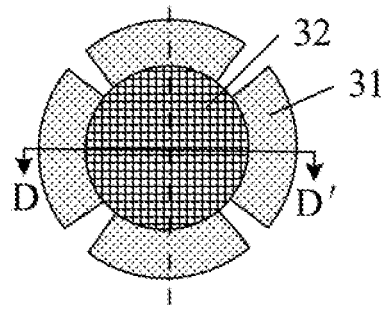
FIG. 11 is a top view of yet another connection structure, in accordance with some embodiments of the present disclosure.
Figure 12:
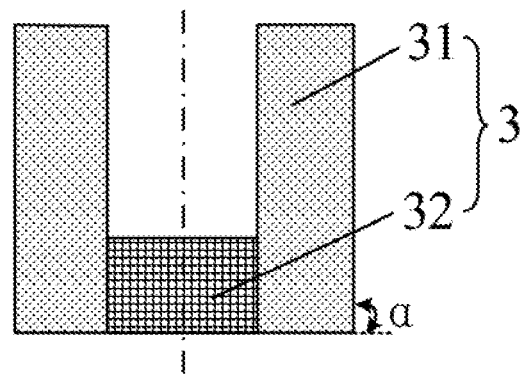
FIG. 12 is a sectional view of the connection structure taken along direction D-D' in FIG. 11.
Figure 13:
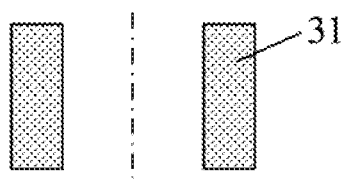
FIG. 13 is a top view of still yet another connection structure, in accordance with some embodiments of the present disclosure.

In some other embodiments, with reference to FIGS. 11 to 13, an orthographic projection of the at least one conductive portion 31 of each connection structure 3 on the base 1 is in a non-closed shape. That is, each connection structure 3 is composed of at least two conductive portions 31 arranged at intervals, so that a boundary shape of an orthographic projection of each connection structure 3 on the base 1 is non-closed. For example, an orthographic projection of each connection structure 3 on the base 1 includes a plurality of orthographic projection portions in one-to-one correspondence with the conductive portions 31 of the connection structure 3, and the plurality of orthographic projection portions are separately arranged.

In some examples, as shown in FIG. 13, each connection structure 3 includes two conductive portions 31 that are opposite and spaced apart, and each conductive portion 31 has an upright sheet structure.

In some other examples, as shown in FIG. 11, each connection structure 3 has a tubular structure with a side wall, the side wall includes at least one crack, and the at least one crack extends to surfaces of end walls on both sides of the tubular structure. That is, the at least one crack divides the tubular structure into at least two independent portions.

In addition, in a case where each connection structure 3 has a tubular structure with a side wall including at least one crack, if one end of each crack of the at least one crack is located in the middle of the tubular structure, and the other end extending to a surface of an end wall on a side of the tubular structure away from the driving electrode, then a boundary shape of an orthographic projection of the tubular structure on the base 1 is closed.

On the basis of the above embodiments, with reference to FIGS. 11 and 12, each connection structure 3 further includes a bottom portion 32 connected to each conductive portion 31 of the connection structure 3, and the bottom portion 32 is directly in contact with the corresponding driving electrode 2. That is, the bottom portion 32 is disposed on a surface of the corresponding driving electrode 2 facing away from the base 1. In this way, not only may each connection structure 3 be ensured to have a high stability, but also an area of each connection structure 3 in contact with the corresponding driving electrode 2 may be increased, thereby improving connection reliability between each connection structure 3 and the corresponding driving electrode 2, and improving transmission efficiency of a driving signal transmitted by the driving electrode 2.

Herein, since the bottom portion 32 of each connection structure 3 is connected to each conductive portion 31 of the connection structure 3, and a shape of the bottom portion 32 is related to a shape surround by the conductive portions 31. For example, the shape surrounded by the conductive portions 31 is tubular, and the bottom portion 32 is in a closed shape which matches a shape of a tubular orifice surrounded by the conductive portions 31. That is, an inner contour of the orthographic projection of each conductive portion 31 on the base overlaps with a portion of an outer contour of an orthographic projection of the bottom portion 32 on the base; or an outer contour of the orthographic projection of each conductive portion 31 on the base overlaps with a portion of an outer contour of the orthographic projection of the bottom portion 32 on the base, so that the bottom portion 32 is connected to each conductive portion 31.

In some examples, with reference to FIGS. 11 and 12, each connection structure 3 includes a plurality of conductive portions 31, and the plurality of conductive portions 31 are arranged at intervals around an outer contour of the bottom portion 32. For example, in each connection structure 3, the orthographic projection of the bottom portion 32 on the base 1 is a circle, and the conductive portions 31 are evenly distributed on the outer contour of the bottom portion 32, and the orthographic projection of each conductive portion 31 on the base 1 is an arc matching the circle.

In addition, in some examples, the at least one conductive portion 31 and the bottom portion 32 in a same connection structure 3 are an integrated structure. That is, the at least one conductive portion 31 and the bottom portion 32 in the same connection structure 3 are integrally formed with a same conductive material, which is convenient for manufacturing.

In some embodiments, a hardness of the at least one conductive portion 31 in each connection structure 3 is greater than a hardness of the corresponding driving electrode 2. For example, the at least one conductive portion 31 in each connection structure 3 is made of a material with a Mohs hardness greater than or equal to 5.5, such as tungsten, titanium, or molybdenum. In this way, it may be ensured that the at least one conductive portion 31 has a stable shape and a good support strength, thereby ensuring that each connection structure 3 has a stable shape and a good support strength.

In some examples, each connection structure 3 further includes a bottom portion 32 connected to the at least one conductive portion 31, and the bottom portion 32 and each conductive portion 31 are made of a same material. Of course, the bottom portion 32 is also in direct contact with the corresponding driving electrode 2, and it is also allowed that the bottom portion 32 and the corresponding driving electrode 2 are made of a same material.

Figure 3:
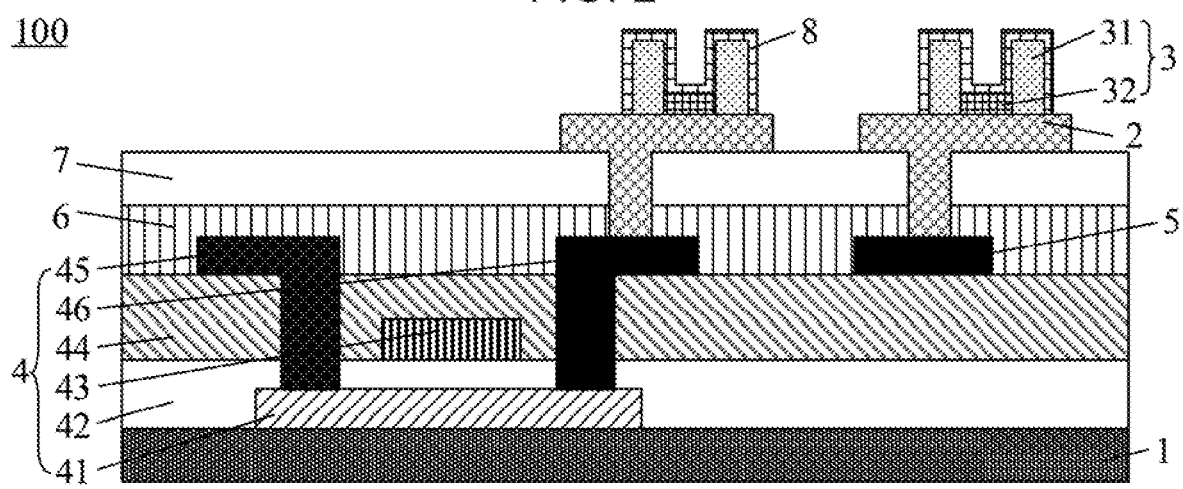
FIG. 3 is a schematic diagram showing a structure of yet another display backplane, in accordance with some embodiments of the present disclosure.
Figure 4:
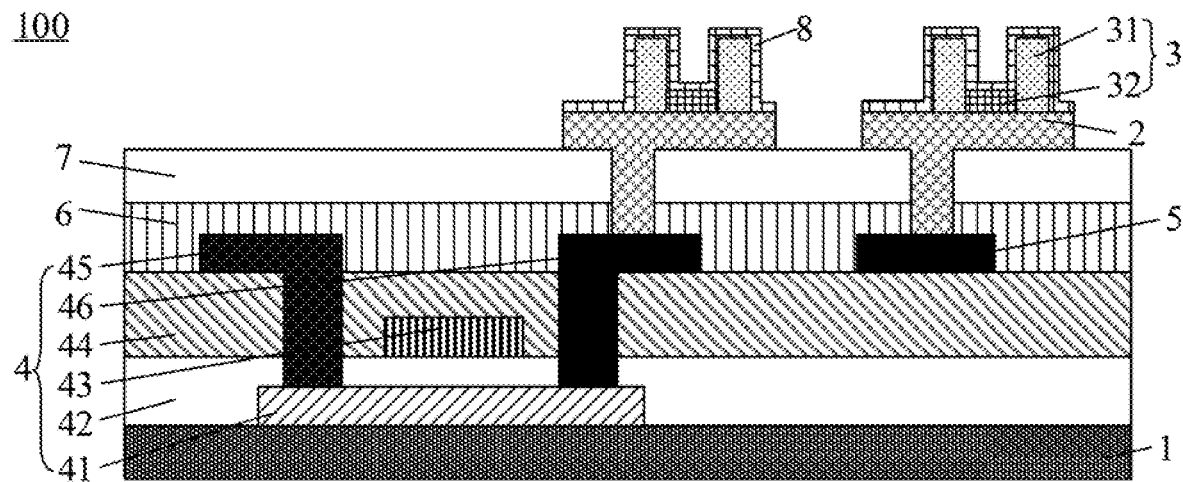
FIG. 4 is a schematic diagram showing a structure of yet another display backplane, in accordance with some embodiments of the present disclosure.
Figure 5:
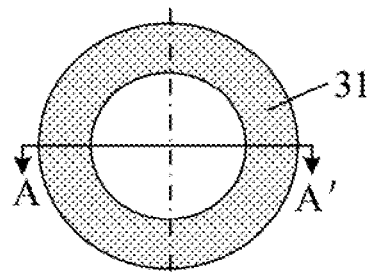
FIG. 5 is a top view of a connection structure, in accordance with some embodiments of the present disclosure.

In some embodiments, with reference to FIGS. 3 and 4, the display backplane 100 further includes a conductive plating layer 8 disposed on the at least one conductive portion 31 in each connection structure 3. The conductive plating layer 8 may cover the corresponding connection structure 3 that is disposed on the corresponding driving electrode 2. In this way, the conductive plating layer 8 may be used to be electrically connected to the corresponding connection structure 3 and to the corresponding driving electrode 2, which is conductive to improve surface conductivity of the corresponding connection structure 3, thereby enhancing electrical connection performances between each connection structure 3 and both the corresponding driving electrode 2 and the corresponding microelectronic component.

In some examples, the conductive plating layer 8 includes at least one of a copper layer, an aluminum layer, or a silver layer.

There are multiple of ways to arrange the conductive plating layer 8.

In some examples, with reference to FIG. 3, an arrangement manner, in which the conductive plating layer 8 is disposed on the at least one conductive portion 31 in each connection structure 3, refers to being disposed on an exposed surface of the at least one conductive portion 31, i.e., a surface other than the surface in contact with the corresponding driving electrode 2. In a case where each connection structure 3 further includes the bottom portion 32, the conductive plating layer 8 is further disposed on a surface of the corresponding bottom portion 32 facing away from the base 1.

In some other examples, with reference to FIG. 4, an arrangement manner, in which the conductive plating layer 8 is disposed on the at least one conductive portion 31 in each connection structure 3, refers to that edges of the conductive plating layer 8 extend to a surface of the driving electrode 2 corresponding to each connection structure 3 facing away from the base 1.

Figure 14:
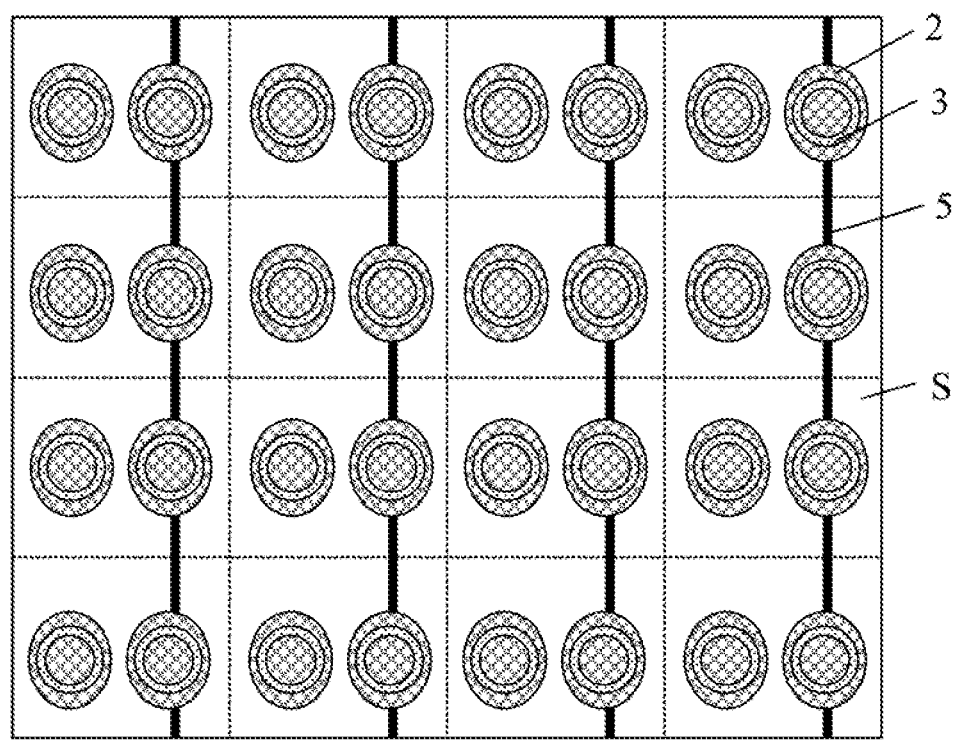
FIG. 14 is a schematic diagram showing a structure of yet another display backplane, in accordance with some embodiments of the present disclosure.
Figure 15:
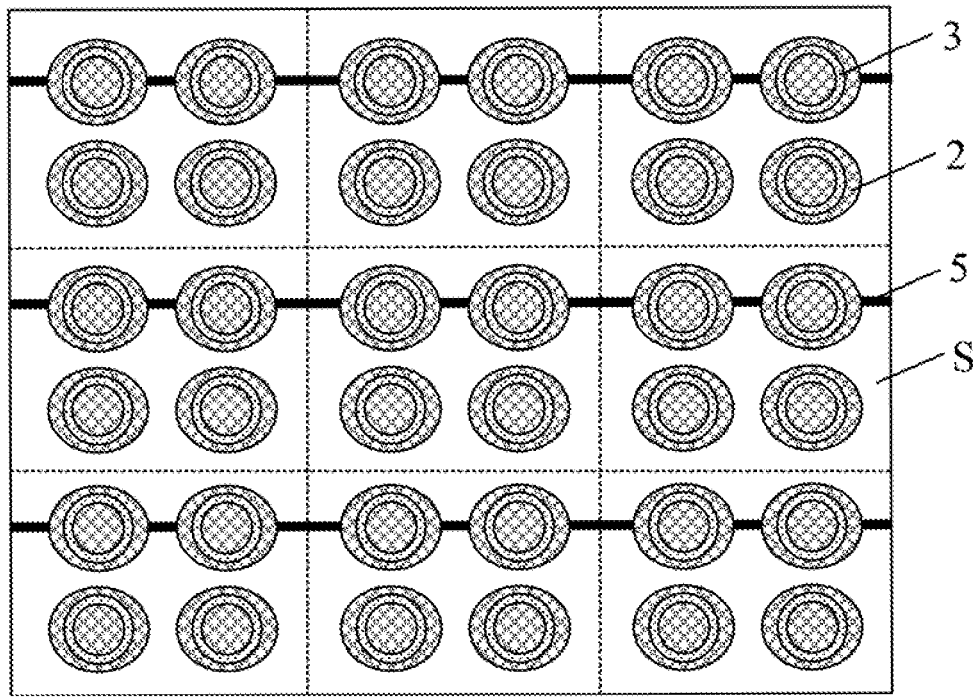
FIG. 15 is a schematic diagram showing a structure of yet another display backplane, in accordance with some embodiments of the present disclosure.

In some embodiments, with reference to FIGS. 14 and 15, the display backplane 100 has a plurality of sub-pixel regions S arranged in an array, and at least two of the plurality of driving electrodes 2 are located in one of the plurality of sub-pixel regions S.

The number of driving electrodes 2 disposed in each sub-pixel region S is optionally set according to actual needs, which is not limited in some embodiments of the present disclosure.

In some examples, the microelectronic component is a Micro-LED having two pins. The driving electrodes 2 in each sub-pixel region S are usually arranged in pairs. That is, each sub-pixel region S is provided with 2N (N=1, 2, 3 . . . ) driving electrodes 2 therein. In this way, each sub-pixel region S corresponds to N Micro-LED(s).

Based on this, with reference to FIG. 1, the display backplane 100 further includes at least one driving transistor 4 located in one of the plurality of sub-pixel regions S and disposed on the base 1, and a plurality of electrode lines 5 disposed above the base 1. An extending direction of each electrode line 5 is parallel (or approximately parallel) to an extending direction of each row of sub-pixel regions S, or an extending direction of each electrode line 5 is parallel (or approximately parallel) to an extending direction of each column of sub-pixel regions S.

Every two driving electrodes 2 in a same sub-pixel region S correspond to one driving transistor 4, and sub-pixel regions S in a same row or a same column correspond to one electrode line 5. One of the every two driving electrodes 2 in the same sub-pixel region S is electrically connected to the corresponding driving transistor 4, and the other is electrically connected to the corresponding electrode line 5. The every two driving electrodes 2 are configured to control a corresponding Micro-LED to emit light or not emit light driven by both the corresponding driving transistor 4 and the corresponding electrode line 5.

Herein, each electrode line 5 is configured to provide a common voltage signal. Optionally, all electrode lines 5 are an integrated structure. That is, all electrode lines 5 are made of a same material in a single patterning process.

The structure of each driving transistor 4 may be optionally set according to actual needs. Each driving transistor 4 is located on a side of the corresponding driving electrode 2 proximate to the base 1. Each driving transistor 4 has a bottom-gate structure or a top-gate structure. For example, each driving transistor 4 has a top-gate structure. With reference to FIG. 1, each driving transistor 4 includes an active layer 41, a gate insulating layer 42, a gate 43 and an interlayer dielectric layer 44 that are sequentially arranged in a stack on the base 1. Each driving transistor 4 further includes a source 45 and a drain 46 both disposed on a side of the interlayer dielectric layer 44 facing away from the gate 43, and the source 45 and the drain 46 are electrically connected to the corresponding active layer 41.

Each electrode line 5 and both the source 45 and the drain 46 in each driving transistor 4 are disposed in a same layer. That is, each electrode line 5 and both the source 45 and the drain 46 in each driving transistor 4 may be made of a same material in a single patterning process.

In some examples, with reference to FIG. 1, a planarization layer 6 and a passivation layer 7 are sequentially disposed in a stack between the driving transistor 4 and the corresponding driving electrode 2, and the driving electrode 2 is electrically connected to the corresponding driving transistor 4 through a via hole penetrating through the planarization layer 6 and the passivation layer 7. With the planarization layer 6 and the passivation layer 7, a side of each driving transistor 4 facing away from the base 1 may be flattened, so as to ensure that the corresponding driving electrodes 2 have a good flatness, and to avoid an occurrence of breakage of the driving electrodes 2.

Figure 16:
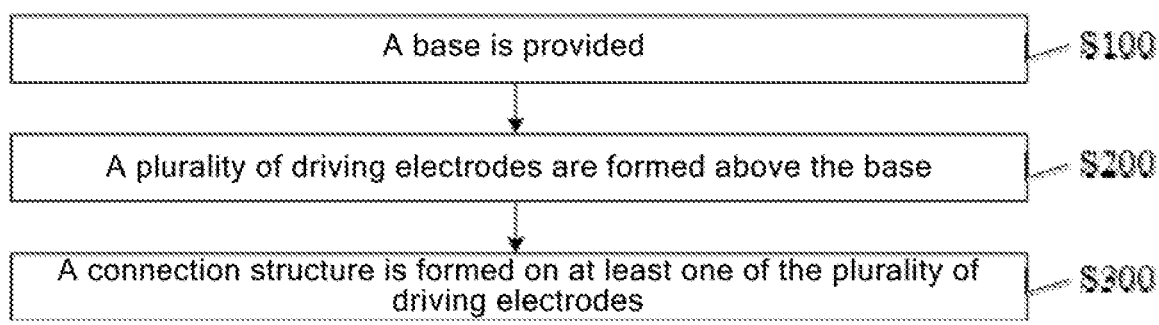
FIG. 16 is a flow chart of a method of manufacturing a display backplane, in accordance with some embodiments of the present disclosure.
Figure 17:
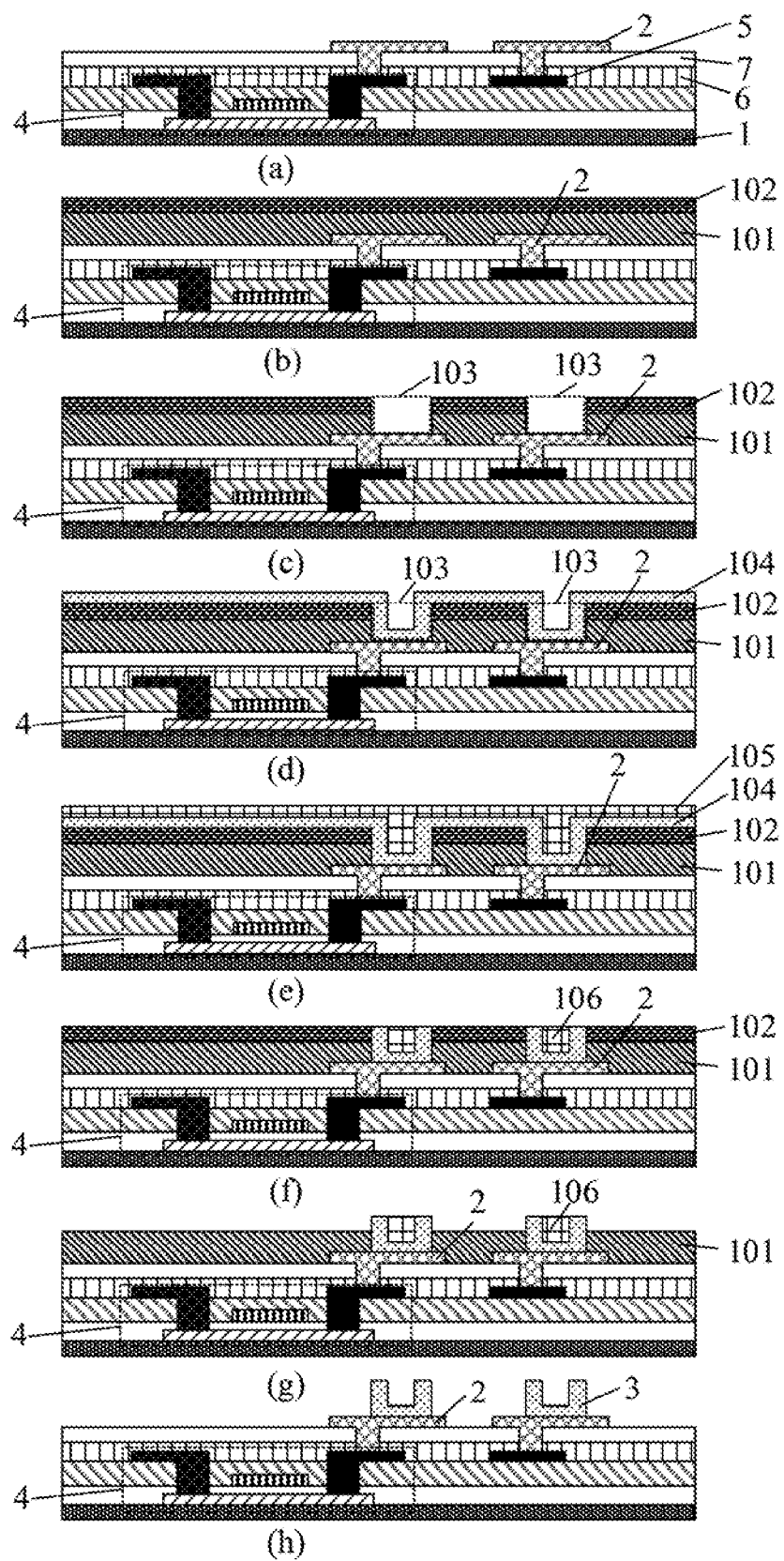
FIG. 17 is a flow chart of manufacturing a display backplane, in accordance with some embodiments of the present disclosure.

Some embodiments of the present disclosure provide a method of manufacturing a display backplane, which is used to manufacture the display backplane 100 provided by some embodiments described above. With reference to FIGS. 16 and 17, the method of manufacturing the display backplane includes steps from S100 to S300.

In S100, a base 1 is provided.

A structure of the base 1 may be optionally set according to actual needs, which is not limited in some embodiments of the present disclosure.

In S200, a plurality of driving electrodes 2 are formed above the base 1.

For example, as shown in (a) of FIG. 17, an electrode layer is deposited above the base 1 by sputtering deposition, and the electrode layer is patterned. That is, the electrode layer is etched in a single patterning process by using of a mask, so as to obtain the plurality of driving electrodes 2.

Herein, a thickness of the driving electrode 2 (i.e., a dimension of the driving electrode 2 in a direction perpendicular to the base 1) is optionally set according to actual needs. For example, the thickness of the driving electrode 2 is within a range from 0.60 μm to 0.80 μm, inclusive. For example, the thickness of the driving electrode 2 is 0.75 μm.

In addition, the driving electrode 2 is made of at least one of conductive metal materials such as titanium, aluminum, copper, chromium, or the like. For example, the driving electrode 2 includes a titanium layer, an aluminum layer, and a titanium layer that are sequentially disposed in a stack, a thickness of the titanium layer is 0.05 μm, a thickness of the aluminum layer is 0.65 μm, and the thickness of the titanium layer is 0.05 μm.

In S300, a connection structure 3 is formed on at least one of the plurality of driving electrodes 2. An orthographic projection of the connection structure 3 on the base 1 is within an orthographic projection of a corresponding driving electrode 2 on the base 1, and the connection structure 3 includes at least one conductive portion 31 disposed at a first included angle α with the corresponding driving electrode 2.

Forming the connection structure 3 on the at least one driving electrode 2 includes forming at least one conductive portion 31 on a surface of each of the at least one driving electrode 2 facing away from the base 1, so as to achieve a good electrical connection between each connection structure 3 and the corresponding driving electrode 2.

The beneficial effects that may be achieved by the method of manufacturing a display backplane provided in some embodiments of the present disclosure are the same as the beneficial effects that may be achieved by the display backplane provided in some embodiments described above, and details are not described herein again.

The method of manufacturing each conductive portion 31 in each connection structure 3 described above is related to its structure, which may be optionally set according to actual needs, some embodiments of the present disclosure do not limit this.

For example, forming the connection structure 3 on the at least one of the plurality of driving electrodes 2 in S300, includes the following steps.

In S310, as shown in (b) of FIG. 17, a first target layer 101 and a second target layer 102 are formed in a stack on a side of at least one of the plurality of driving electrodes 2 facing away from the base 1, and a hardness of the second target layer 102 is greater than a hardness of the first target layer 101.

In some examples, materials of the first target layer 101 and the second target layer 102 may be optionally set according to actual needs. Optionally, the material of the first target layer 101 is an organic insulating material, and the organic insulating material includes a photosensitive resin material, such as a positive photoresist resin. Optionally, the material of the second target layer 102 is an inorganic material, such as silicon dioxide, or the material of the second target layer 102 is a metal material, such as aluminum, copper, tungsten, titanium, molybdenum, or the like. Optionally, the material of the first target layer 101 is an organic insulating material, and the material of the second target layer 102 is an inorganic material or a metal material.

The first target layer 101 is made of an organic insulating material by coating, and the second target layer 102 is made of an inorganic material or a metal material by chemical vapor deposition (e.g., plasma enhanced chemical vapor deposition, abbreviated as PECVD). A thickness of the first target layer 101 (i.e., a dimension of the first target layer 101 in the direction perpendicular to the base 1) is generally greater than a thickness of the second target layer 102.

Herein, the thickness of the first target layer 101 may be determined according to the requirements of a height of each conductive portion 31 in the corresponding connection structure 3 (i.e., a dimension of the conductive portion 31 in the direction perpendicular to the base 1). For example, the thickness of the first target layer 101 is within a range from 3 μm to 4 μm, inclusive, and the thickness of the second target layer 102 is within a range from 0.15 μm to 0.25 μm, inclusive.

In S320, as shown in (c) of FIG. 17, at least one through hole 103 penetrating through the second target layer 102 and the first target layer 101 is formed, and the at least one through hole 103 is located in a region where the at least one of the plurality of driving electrodes 2 is located, and the at least one through hole 103 is in a one-to-one correspondence with the at least one driving electrode 2.

Herein, the thickness of the first target layer 101 is greater than the thickness of the second target layer 102, and the first target layer 101 with a greater thickness may ensure that the formed at least one through hole 103 has a large depth. The hardness of the second target layer 102 is greater than the hardness of the first target layer 101, and the second target layer 102 with greater hardness may ensure that the formed at least one through hole has an orifice in a stable shape and a steep hole wall, thereby ensuring that each of the at least one through hole is precisely formed.

The at least one through hole 103 is located in a region where the at least one driving electrode 2 is located. That is, an orthographic projection of each through hole 103 on the base 1 is within an orthographic projection of the corresponding driving electrode 2 on the base 1. Each through hole 103 penetrates through the second target layer 102 and the first target layer 101. That is, a surface of the driving electrode 2 in a region where the corresponding through hole 103 is located is exposed in the corresponding through hole 103.

A shape and a formation method of each through hole 103 are related to the structure of each conductive portion 31 in the corresponding connection structure 3. For example, the connection structure 3 is a conductive portion of a circular tube shape, and an aperture of the corresponding through hole is the same as an outer diameter of the tube of the conductive portion. Or, for another example, the connection structure 3 is a conductive portion of a polygonal tube, and an aperture of the corresponding through hole is the same as the largest diagonal dimension of the conductive portion in a direction parallel to the base 1. Optionally, the aperture of each through hole 103 is within a range from 1 μm to 8 μm, inclusive.

In S330, as shown in (d) of FIG. 17, a first metal film 104 is deposited, and a portion of the first metal film 104 located in each of the at least one through hole 103 is electrically connected to the corresponding driving electrode 2.

For example, the first metal film 104 is formed on a surface of the second target layer 102 facing away from the base 1 and formed in the at least one through hole 103 by sputtering deposition, and the portion of the first metal film 104 located in each through hole 103 covers an exposed surface of the corresponding driving electrode 2 and is in direct contact with the driving electrode 2.

A material of the first metal film 104 may be optionally set according to actual needs, which is not limited in some embodiments of the present disclosure. For example, the first metal film 104 is made of a metal material with a Mohs hardness greater than or equal to 5.5, as shown in Table 1.

TABLE 1

| Name | Property | |
|---|---|---|
| | Mohs hardness | Resistivity (nΩ · m) |
| Tungsten | 7.5 | 53 |
| Titanium | 6.0 | 420 |
| Molybdenum | 5.5 | 52 |

In S340, the first metal film 104 is patterned to retain the portion of the first metal film 104 in each through hole 103.

In S350, the second target layer 102 and the first target layer 101 are removed to form the connection structure 3.

Herein, the second target layer 102 is made of an inorganic material or a metal material, and the second target layer 102 is usually removed by dry etching. The first target layer 101 is made of an organic insulating material, and the first target layer 101 is usually removed by plasma etching, such as oxygen plasma etching.

In addition, optionally, a thickness of a portion of the first metal film 104 on a surface of the second target layer 102 facing away from the base 1 is within a range from 0.3 μm to 4.0 μm, inclusive. A thickness of a portion of the first metal film 104 located on a side wall of each through hole 103 is within a range from 0.1 μm to 2 μm, inclusive. In this way, it may be ensured that the formed connection structure 3 further has a good electrical connection on the basis of having the required mechanical strength, after patterning the first metal film 104 and retaining the portion of the first metal film 104 in each through hole 103.

In S340, the first metal film 104 may be patterned in various ways, and the patterning may be selected according to actual needs. Some embodiments of the present disclosure do not limit this.

In some examples, the patterning of the first metal film 104 in S340 is performed by dry etching with a mask. A pattern of openings of the mask is determined according to the design of the pattern to be formed of the first metal film 104. In addition, optionally, the second target layer 102 is made of a metal material, in this way, the second target layer 102 and the first metal film 104 may be patterned by using of a same mask. The manufacturing process is simple and easy to be implemented, which may effectively shorten process flows of manufacturing the connection structure 3.

In some other examples, the patterning of the first metal film 104 in S340 is performed by means of chemical mechanical polishing (CMP).

For example, S340 includes: coating a portion of the first metal film 104 in each through hole 103 with a photoresist to protect the portion of the first metal film 104 in each through hole 103; then, patterning the first metal film 104 by means of CMP to remove a portion of the first metal film 104 that is not protected by the photoresist.

Accordingly, S350 further includes removing the photoresist. For example, the photoresist is removed by plasma etching. In some examples, the photoresist and the first target layer 101 may be simultaneously removed by a single plasma etching process.

It will be noted that the portion of the first metal film 104 in each through hole 103 is coated with the photoresist. That is, on the basis of ensuring that the photoresist is precisely aligned with the corresponding through hole 103, each through hole 103 is filled in or filled with the photoresist. In this way, it is conductive to obtain a required connection structure 3 through the protection of the photoresist.

In yet some other examples, the aperture of each through hole 103 is within a range from 0.1 μm to 1 μm, inclusive. Patterning the first metal film 104 in S340 includes steps S341 to S343.

In S341, as shown in (e) of FIG. 17, a photoresist 105 is formed by a coating process, and the photoresist 105 at least covers the portion of the first metal film 104 in each through hole 103.

For example, the photoresist 105 covers an entire surface of the first thin metal film 104 facing away from the base 1, and a surface of the photoresist 105 facing away from the base 1 is a substantially flat surface.

In S342, the photoresist 105 is pattered to retain a portion of the photoresist 105 in each through hole 103, taking a surface of the base 1 as a reference plane, and a surface of the patterned photoresist 106 facing away from the base 1 is not lower than a surface of the first metal film 104 facing away from the base 1, and a dimension of an orthographic projection of the portion of the patterned photoresist 106 in each through hole 103 on the base 1 is the same as or approximately the same as the aperture of the corresponding through hole 103.

Herein, the patterning of the photoresist 105 may be performed by plasma etching with equal thickness. In this way, etching amounts of the photoresist are the same in the direction perpendicular to the base 1, which may ensure that the surface of the patterned photoresist 106 facing away from the base 1 and a surface of a portion of the first metal film 104 that is not located in each through hole 103 facing away from the base 1 are coplane or substantially coplane. Thus, the portion of the patterned photoresist 106 in each through hole 103 is merely retained, thereby protecting the portion of the first metal film 104 in each through hole 103.

In S343, as shown in (f) of FIG. 17, the first metal film 104 is patterned by dry etching or CMP. That is, the portion of the first metal film 104 that is not protected by the patterned photoresist 106 is removed.

Accordingly, as shown in (g) and (h) in FIG. 17, S350 further includes removing the patterned photoresist 106. For example, the patterned photoresist 106 is removed by plasma etching. In some examples, the patterned photoresist 106 and the first target layer 101 may be simultaneously removed by a single plasma etching process.

In addition, optionally, the second target layer 102 is made of a metal material, and the removal of the second target layer 102 and the patterning of the first metal film 104 may be performed in a same dry etching process or a same CMP process, so as to simplify the manufacturing process of each connection structure 3.

In some embodiments of the present disclosure, by coating the surface of the first metal film 104 facing away from the base 1 with an entire layer of the photoresist 105, a portion of the photoresist 105 may be spontaneously filled in each through hole 103. After the photoresist is patterned, the surface of the patterned photoresist 106 facing away from the base 1 is not lower than the surface of the first metal film 104 facing away from the base 1. That is, the patterned photoresist 106 is the portion of the photoresist 105 left in each through hole 103. In this way, a self-alignment between the patterned photoresist 106 and the through holes 103 is achieved, and alignment precision is effectively improved, thereby ensuring a forming precision of the corresponding connection structures 3, and realizing mass production of the connection structures 3 in a large area.

Figure 18:
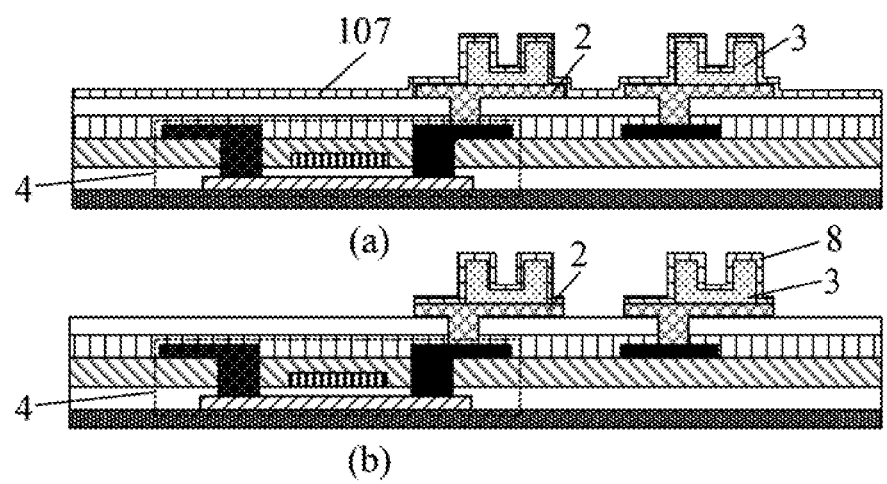
FIG. 18 is a flow chart of manufacturing a conductive plating layer in a display backplane, in accordance with some embodiments of the present disclosure.

In some embodiments, with reference to FIGS. 3, 4 and 18, the method of manufacturing the display backplane further includes S400.

In S400, a conductive plating layer 8 is formed on each connection structure 3.

In some examples, a structure of the conductive plating layer 8 is shown in FIG. 3. The conductive plating layer 8 is formed on an exposed surface of a corresponding connection structure 3, so that the conductive plating layer 8 covers the corresponding connection structure 3 that is disposed on the corresponding driving electrode 2.

In some other examples, the structure of the conductive plating layer 8 is shown in FIG. 4. The method of manufacturing the conductive plating layer 8 is shown in (a) and (b) of FIG. 18. First, a second metal film 105 is deposited by sputtering deposition, and the second metal film 105 at least covers exposed surfaces of the driving electrodes 2 and the connection structures 3. Then, the second metal film 105 is patterned to obtain the conductive plating layer 8 disposed on each connection structure 3 and the corresponding driving electrode 2.

Herein, optionally, the second metal film 105 is made of at least one material of copper, aluminum, or silver.

In addition, the patterning of the second metal film 105 is performed by dry etching with a mask.

Optionally, it is convenient to manufacture that the conductive plating layer 8 and the corresponding driving electrode 2 are formed by etching a same pattern with a same mask.

In some embodiments of the present disclosure, the conductive plating layer 8 is used to electrically connect the corresponding connection structure 3 and the corresponding driving electrode 2, which is conductive to improve the surface conductivity of the corresponding connection structure 3, thereby enhancing electrical connection performances between each connection structure 3 and both the corresponding driving electrode 2 and the corresponding microelectronic component.

Figure 19:
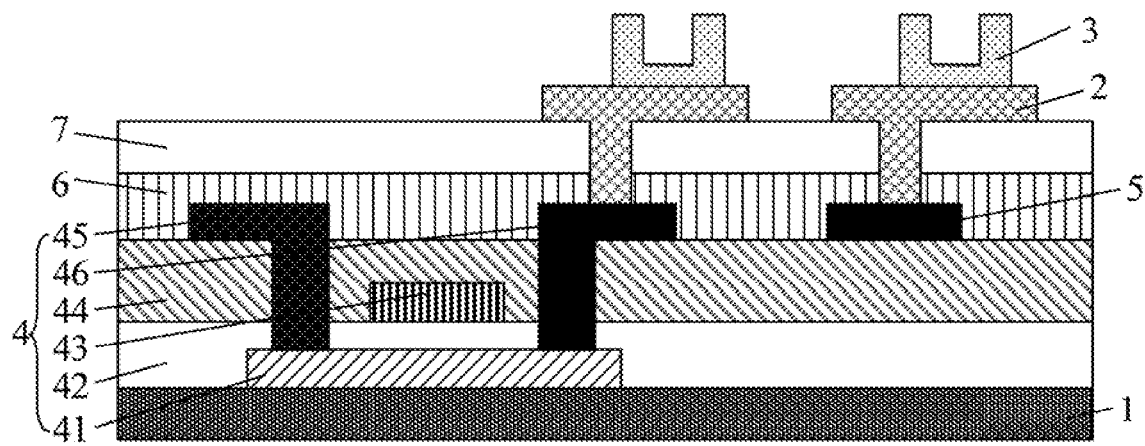
FIG. 19 is a schematic diagram showing a structure of a display device, in accordance with some embodiments of the present disclosure.

Some embodiments of the present disclosure provide a display device 200. With reference to FIG. 19, the display device 200 includes a display backplane 100 as provided in some embodiments described above, and a Micro-LED 9 electrically connected to every two connection structures 3 in the display backplane 100 correspondingly.

For example, the number of pixels of the display device is generally at a level of millions. The display device as a 4K ultra-high definition (abbreviated as UHD) Micro-LED display screen is taken as an example. A resolution of the display screen is 3840×2160 with 8,294,400 pixels. Each Micro-LED 9 corresponds to a primary color, that is, each pixel corresponds to three Micro-LEDs. This means that the display screen has 24,883,200 Micro-LEDs, and a level of tens of millions Micro-LEDs need to be bound in the display device.

The Micro-LED 9 generally includes an LED body 91 and two pins 92, and the two pins 92 are disposed on the LED body 91 and electrically connected to corresponding two connection structures 3, respectively. Each connection structure 3 is disposed on the corresponding driving electrode 2. A set position of each driving electrode 2 is usually designed according to a set position of the corresponding pin 92 in the Micro-LED 9, so as to ensure that each driving electrode 2 may be electrically connected to the corresponding pin 92 through the corresponding connection structure 3. For example, an orthographic projection of each pin 92 on the base 1 is within an orthographic projection of the corresponding driving electrode 2 on the base 1.

In addition, an overall size of the Micro-LED 9 is generally less than 100 μm, and a size of the pins 92 of the Micro-LED 9 is less than the overall size of the Micro-LED 9, so that the pins 92 of the Micro-LED 9 is usually in a form of a metal welding spot, and an electrical connection between the pins 92 of the Micro-LED 9 and the corresponding connection structure 3 is realized by plugging.

For example, an end of each connection structure 3 facing away from the base 1 has a relatively sharp structure, such as a structure with a sharp corner or a thin wall, so that during the mass transfer process of a plurality of Micro-LEDs 9 to the display backplane 100, each connection structure 3 may effectively penetrate into the corresponding pin 92 to ensure a good electrical connection between each connection structure 3 and the corresponding pin 92.

An alignment precision between each connection structure 3 and the corresponding pin 92 is related to a forming precision in the related manufacturing process. In the process of designing each connection structure 3, the forming precision that may be achieved by a corresponding manufacturing process is referred to. That is, an area of the orthographic projection of each connection structure 3 on the corresponding driving electrode 2 may be reasonably determined according to a possible alignment precision between each connection structure 3 and the corresponding pin 92.

For example, in a case where there is a high alignment precision between each connection structure 3 and the corresponding pin 92, an outer contour of the orthographic projection of each connection structure 3 on the corresponding driving electrode 2 may be within a region where the orthographic projection of the corresponding pin 92 on the driving electrode 2 is located, so as to ensure a good electrical connection between each connection structure 3 and the corresponding pin 92.

For example, in a case where there is a low alignment precision between each connection structure 3 and the corresponding pin 92, the outer contour of the orthographic projection of each connection structure 3 on the corresponding driving electrode 2 may be located outside the region where the orthographic projection of the corresponding pin 92 on the driving electrode 2 is located, and the orthographic projection of each connection structure 3 on the corresponding driving electrode 2 may cover the orthographic projection of the corresponding pin 92 on the driving electrode 2. In this way, in a case where there is a misalignment between each connection structure 3 and the corresponding pin 92, it may still be ensured that the orthographic projection of each pin 92 on the corresponding driving electrode 2 is within the outer contour of the orthographic projection of the corresponding connection structure 3 on the driving electrode 2, that is, to ensure an effective electrical connection between each connection structure 3 and the corresponding pin 92.

The beneficial effects that may be achieved by the display device provided by some embodiments of the present disclosure are the same as the beneficial effects that may be achieved by the display backplane provided by some of the above embodiments, and details are not described herein again.

As shown in FIG. 19, a material of the pins 92 of the Micro-LED 9 may be optionally set according to actual needs, which is not limited in some embodiments of the present disclosure. For example, the material of the pins 92 of the Micro-LED 9 is shown in Table 2.

TABLE 2

| Name | Property | |
|---|---|---|
| | Mohs hardness | Resistivity (nΩ · m) |
| Copper | 3.0 | 16.73 |
| Aluminum | 2.75 | 26.55 |
| Gold | 2.5 | 23.5 |
| Indium | 1.2 | 88 |

Thus, a hardness of each connection structure 3 in the display backplane 100 is greater than a hardness of the pins 92 of the corresponding Micro-LED 9. In this way, during the mass transfer process of a plurality of Micro-LEDs 9 to the display backplane 100 and bonding the plurality of Micro-LEDs 9 to the corresponding connection structures 3, the connection structures 3 may be plugged into the pins 92 (i.e., metal welding spots) of the corresponding Micro-LEDs 9 almost at the same time to achieve a good electrical connection through the interdiffusion in metals.

In this way, there is no need to bond the plurality of Micro-LEDs 9 one by one, thereby effectively improving a bonding efficiency, a bonding yield, and a bonding reliability of each Micro-LED 9 and the corresponding driving electrode 2 in the display backplane 100, and effectively reducing a cost of manufacturing the display device 200. In addition, the mass transfer process of the plurality of Micro-LEDs 9 to the display backplane 100 may be performed at ambient temperature, which is convenient for manufacturing.

In some examples, the display device 200 is a product or component having a display function such as a mobile phone, a tablet computer, a notebook computer, a display, or a TV.

In the description of the above embodiments, specific features, structures, materials or characteristics may be combined in any suitable manner in any one or more embodiments or examples.

The forgoing descriptions are merely specific implementation manners of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A display backplane having a plurality of sub-pixel regions, comprising:
   a base;
   a plurality of driving electrodes disposed above the base, at least two of the plurality of driving electrodes being located in one of the plurality of sub-pixel regions;
   a connection structure disposed on at least one of the plurality of driving electrodes, an orthographic projection of the connection structure on the base being within an orthographic projection of a corresponding driving electrode on the base; and
   at least one driving transistor located in one of the plurality of sub-pixel regions and disposed on the base;
   wherein the connection structure includes at least one conductive portion disposed at a first included angle with the corresponding driving electrode,
   wherein the at least two driving electrodes are located on a side of a corresponding driving transistor facing away from the base, and
   wherein one of every two driving electrodes in a same sub-pixel region is electrically connected to a corresponding driving transistor.

2. The display backplane according to claim 1, wherein the first included angle is within a range from 85° to 95°, inclusive.

3. The display backplane according to claim 1, wherein the connection structure further includes a bottom portion connected to the at least one conductive portion, and the bottom portion is directly in contact with the corresponding driving electrode.

4. The display backplane according to claim 3, wherein the at least one conductive portion and the bottom portion in a same connection structure are an integrated structure.

5. The display backplane according to claim 3, wherein the at least one conductive portion includes a plurality of conductive portions, and the plurality of conductive portions are arranged at intervals around a contour of the bottom portion.

6. The display backplane according to claim 1, wherein an orthographic projection of the at least one conductive portion on the base is in a closed shape.

7. The display backplane according to claim 6, wherein the at least one conductive portion has a tubular structure.

8. The display backplane according to claim 1, wherein the at least one conductive portion has a tubular structure with a side wall, the side wall includes at least one crack, and the at least one crack extends to a surface of an end wall on a side of the tubular structure away from the driving electrode.

9. The display backplane according to claim 1, wherein a hardness of the at least one conductive portion is greater than a hardness of the corresponding driving electrode.

10. The display backplane according to claim 9, wherein a material of the at least one conductive portion includes tungsten, titanium or molybdenum.

11. The display backplane according to claim 1, further comprising a conductive plating layer disposed on the at least one conductive portion in each connection structure.

12. A method of manufacturing a display backplane having a plurality of sub-pixel regions, comprising:
providing a base;
forming a plurality of driving electrodes above the base, at least two of the plurality of driving electrodes being located in one of the plurality of sub-pixel regions;
forming a connection structure on at least one of the plurality of driving electrodes, an orthographic projection of the connection structure on the base being within an orthographic projection of a corresponding driving electrode on the base, and the connection structure including at least one conductive portion disposed at a first included angle with the corresponding driving electrode; and
forming at least one driving transistor located in one of the plurality of sub-pixel regions and disposed on the base, the at least two driving electrodes being located on a side of a corresponding driving transistor facing away from the base, and one of every two driving electrodes in a same sub-pixel region being electrically connected to a corresponding driving transistor.

13. The method of manufacturing the display backplane according to claim 12, wherein forming the connection structure on at least one of the plurality of driving electrodes, includes:
forming a first target layer and a second target layer in a stack on a side of at least one of the plurality of driving electrodes facing away from the base, and a hardness of the second target layer being greater than a hardness of the first target layer;
forming at least one through hole penetrating through the second target layer and the first target layer, the at least one through hole being located in a region where the at least one of the plurality of driving electrodes is located, and the at least one through hole being in a one-to-one correspondence with the at least one driving electrode;
depositing a first metal film, and a portion of the first metal film in each through hole of the at least one through hole being electrically connected to a corresponding driving electrode;
patterning the first metal film to retain the portion of the first metal film in each through hole; and
removing the second target layer and the first target layer to form the connection structure.

14. The method of manufacturing the display backplane according to claim 13, wherein after the first metal film is deposited and before the first metal film is patterned, the method of manufacturing the display backplane further comprises:
forming a photoresist on the portion of the first metal film in each through hole by a coating process;
patterning the first metal film, further includes: patterning the first metal film by chemical mechanical polishing; and
removing the second target layer and the first target layer to form the connection structure, further includes:
removing the second target layer, the first target layer and the photoresist to form the connection structure.

15. The method of manufacturing the display backplane according to claim 13, wherein after the first metal film is deposited and before the first metal film is patterned, the method of manufacturing the display backplane further comprises:
forming a photoresist by a coating process, and the photoresist at least covering the portion of the first metal film in each through hole; and
patterning the photoresist to retain a portion of the photoresist in each through hole, wherein taking a surface of the base as a reference plane, a surface of the patterned photoresist facing away from the base is not lower than a surface of the first metal film facing away from the base, and a dimension of an orthographic projection of the portion of the patterned photoresist in each through hole on the base is same as or approximately same as an aperture of a corresponding through hole; and
removing the second target layer and the first target layer to form the connection structure, further includes:
removing the second target layer, the first target layer and the patterned photoresist to form the connection structure.

16. The method of manufacturing the display backplane according to claim 13, wherein
a material of the first target layer is an organic insulating material;
or, a material of the second target layer is one of an inorganic insulating material and a metal material;
or, a material of the first target layer is an organic insulating material, and a material of the second target layer is one of an inorganic insulating material and a metal material.

17. A display device, comprising:
the display backplane according to claim 1; and
a micro light-emitting diode electrically connected to every two connection structures in the display backplane correspondingly.

* * * * *